(12) United States Patent
Kim et al.

(10) Patent No.: US 12,733,153 B2
(45) Date of Patent: Sep. 8, 2026

(54) SEMICONDUCTOR DEVICE AND METHOD FOR FABRICATING THE SAME

(71) Applicant: SK hynix Inc., Gyeonggi-do (KR)

(72) Inventors: Il Do Kim, Gyeonggi-do (KR); Lynn Lee, Gyeonggi-do (KR); Seung Bum Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 446 days.

(21) Appl. No.: 18/324,150

(22) Filed: May 26, 2023

(65) Prior Publication Data

US 2024/0224511 A1 Jul. 4, 2024

(30) Foreign Application Priority Data

Dec. 30, 2022 (KR) ........................ 10-2022-0190775

(51) Int. Cl.
*H10B 12/00* (2023.01)
*H10D 1/68* (2025.01)

(52) U.S. Cl.
CPC ........... *H10B 12/488* (2023.02); *H10B 12/03* (2023.02); *H10B 12/0335* (2023.02); *H10B 12/05* (2023.02); *H10B 12/30* (2023.02); *H10B 12/033* (2023.02); *H10D 1/711* (2025.01); *H10D 1/714* (2025.01)

(58) Field of Classification Search
CPC ........ H10B 12/03–0387; H10B 12/488; H10B 12/0335; H10B 12/0385
See application file for complete search history.

(56) References Cited

U.S. PATENT DOCUMENTS 6,159,839 A * 12/2000 Jeng .................. H01L 21/76897 257/E21.507
2015/0263167 A1 9/2015 Miyata
2019/0115351 A1* 4/2019 Jeon .................. H10B 12/0335
(Continued)

FOREIGN PATENT DOCUMENTS

KR 10-2022-0005866 A 1/2022
KR 10-2022-0041332 A 4/2022

OTHER PUBLICATIONS

Office Action for Korean Patent Application No. 10-2022-0190775 issued by the Korean Patent Office on Apr. 16, 2026.

*Primary Examiner* — Christine S. Kim
*Assistant Examiner* — Tyler J Wiegand
(74) *Attorney, Agent, or Firm* — IP & T GROUP LLP

(57) ABSTRACT

A semiconductor device includes: a vertical conductive line; a horizontal layer oriented horizontally from the vertical conductive line; a horizontal conductive line crossing the horizontal layer; and a data storage element in contact with the horizontal layer, wherein the data storage element includes: a first electrode including a first cylinder that is in contact with an edge of an upper portion of the horizontal layer and a second cylinder that is in contact with an edge of a lower portion of the horizontal layer; a second electrode disposed over the first electrode; and a dielectric layer between the first electrode and the second electrode, and the second electrode includes: a sharing portion disposed in a gap between the first cylinder and the second cylinder; inner portions disposed on an inner surface of the first cylinder and an inner surface of the second cylinder; and outer portions disposed over the first cylinder and below the second cylinder.

18 Claims, 17 Drawing Sheets

(56) References Cited

U.S. PATENT DOCUMENTS

| | | | | |
|---|---|---|---|---|
| 2021/0257368 | A1* | 8/2021 | Jung ...................... | H10B 12/03 |
| 2022/0045094 | A1 | 2/2022 | Lee et al. | |
| 2022/0068859 | A1 | 3/2022 | Choi et al. | |
| 2022/0102358 | A1* | 3/2022 | Park ...................... | H10B 12/03 |
| 2022/0139936 | A1 | 5/2022 | Ocker | |

* cited by examiner

SEMICONDUCTOR DEVICE AND METHOD FOR FABRICATING THE SAME

CROSS-REFERENCE TO RELATED APPLICATIONS

The present application claims priority of Korean Patent Application No. 10-2022-0190775, filed on Dec. 30, 2022, which is incorporated herein by reference in its entirety.

BACKGROUND

1. Field

Embodiments of the present invention relate generally to semiconductor technology and, more particularly, to a semiconductor device including memory cells that are arranged in three dimensions, and a method for fabricating the same.

2. Description of the Related Art

To satisfy the recent demands for large capacity and miniaturization of memory devices, three-dimensional (3-D) memory devices including memory cells that are stacked in three dimensions have been suggested.

SUMMARY

Embodiments of the present invention are directed to a 3-D semiconductor device (hereinafter referred to simply as semiconductor device) including highly integrated memory cells, and a method for fabricating the semiconductor device.

In accordance with an embodiment of the present invention, a semiconductor device includes: a vertical conductive line; a horizontal layer oriented horizontally from the vertical conductive line; a horizontal conductive line crossing the horizontal layer; and a data storage element in contact with the horizontal layer, wherein the data storage element includes: a first electrode including a first cylinder that is in contact with an edge of an upper portion of the horizontal layer and a second cylinder that is in contact with an edge of a lower portion of the horizontal layer; a second electrode disposed over the first electrode; and a dielectric layer between the first electrode and the second electrode, and the second electrode includes: a sharing portion disposed in a gap between the first cylinder and the second cylinder; inner portions disposed on an inner surface of the first cylinder and an inner surface of the second cylinder; and outer portions disposed over the first cylinder and below the second cylinder.

In accordance with another embodiment of the present invention, a semiconductor device includes: a vertical conductive line; a horizontal layer oriented horizontally from the vertical conductive line; a horizontal conductive line crossing the horizontal layer; and a data storage element in contact with the horizontal layer, wherein the data storage element includes: a first electrode including an inner cylinder that is in contact with an edge of the horizontal layer, and an outer cylinder surrounding the inner cylinder; a second electrode disposed over the first electrode; and a dielectric layer disposed between the first electrode and the second electrode, and the second electrode includes: an outer electrode disposed on an outer surface of the outer cylinder; and inner electrodes disposed on an inner surface of the outer cylinder and an inner surface of the inner cylinder. The inner cylinder and the outer cylinder are in contact to each other.

The inner cylinder includes a through portion which is oriented horizontally, and one side of the inner cylinder is in contact with an edge of the horizontal layer. An outer electrode of the second electrode has a shape surrounding the outer cylinder. The inner electrodes of the second electrode include: a first inner electrode which is disposed on an inner surface of the outer cylinder and surrounding an outer surface of the inner cylinder; and a second inner electrode which is disposed on an inner surface of the inner cylinder. The semiconductor device further comprising double contact nodes in contact with the first electrode and disposed on an edge of a lower portion of the horizontal layer and an edge of an upper portion of the horizontal layer; and a capping layer disposed between the horizontal conductive line and the double contact nodes. The horizontal layer includes monocrystalline silicon, an oxide semiconductor, polysilicon, or a combination thereof. The horizontal conductive line includes: a first horizontal conductive line disposed on an upper surface of the horizontal layer; and a second horizontal conductive line disposed on a lower surface of the horizontal layer. The horizontal conductive line includes a dual work function structure.

In accordance with another embodiment of the present invention, a method for fabricating a semiconductor device includes: forming a stack body in which a first dielectric layer, a first sacrificial layer, a semiconductor layer, a second sacrificial layer, and a second dielectric layer are sequentially stacked in a mentioned order over a lower structure; forming an opening by etching the stack body; replacing a portion of the semiconductor layer from the opening with a semiconductor layer-level sacrificial layer; forming a pair of sacrificial layer-level recesses by recessing the first and second sacrificial layers; forming a first electrode that is in contact to a first-side edge of the semiconductor layer and includes dual cylinders disposed in the pair of the sacrificial layer-level recesses; removing the semiconductor layer-level sacrificial layer; forming a dielectric layer over the first electrode; and forming a second electrode over the dielectric layer. The method further comprising before the forming of the first electrode including the dual cylinders, forming capping layers partially filling the sacrificial layer-level recesses; and forming double contact nodes partially filling the sacrificial layer-level recesses over the capping layers. The double contact nodes directly contact the dual cylinders. The double contact nodes include doped polysilicon. The dual cylinders include a first cylinder in contact with an edge of an upper portion of the semiconductor layer; and a second cylinder in contact with an edge of a lower portion of the semiconductor layer. The second electrode includes inner portions disposed on an inner surface of the first cylinder and an inner surface of the second cylinder; outer portions disposed over the first cylinder and below the second cylinder; and a sharing portion disposed in a gap between the first cylinder and the second cylinder. The dual cylinders include: an inner cylinder in contact with an edge of the semiconductor layer; and an outer cylinder enclosing the inner cylinder, and the inner cylinder includes a horizontally oriented through portion.

In accordance with another embodiment of the present invention, a semiconductor device includes: a lower structure; a semiconductor layer disposed over the lower structure and oriented horizontally in a direction parallel to the surface of the lower structure; a first electrode including a first cylinder in contact with an edge of an upper portion of the semiconductor layer and a second cylinder in contact with an edge of a lower portion of the semiconductor layer; a second electrode disposed over the first electrode; and a dielectric layer between the first electrode and the second electrode, wherein the second electrode includes: a sharing portion disposed in a gap between the first cylinder and the second cylinder; inner portions disposed on an inner surface of the first cylinder and an inner surface of the second cylinder; and outer portions disposed over the first cylinder and below the second cylinder.

DETAILED DESCRIPTION

Figure 1A:
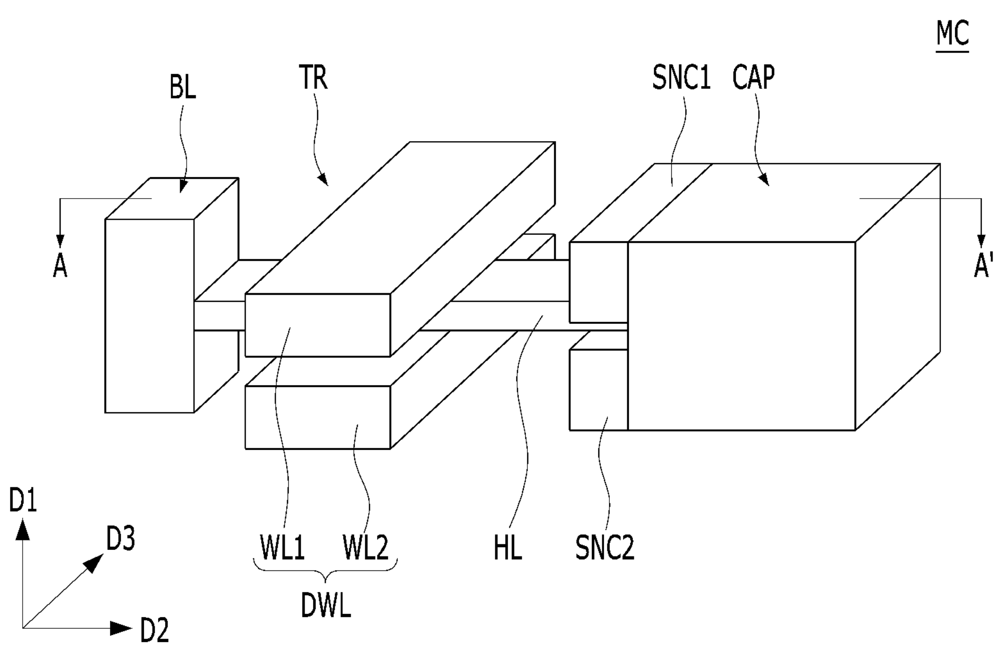
FIG. 1A is a schematic perspective view illustrating a memory cell in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiment of the present invention, memory cells may be vertically stacked to increase memory cell density and reduce parasitic capacitance.

Figure 1B:
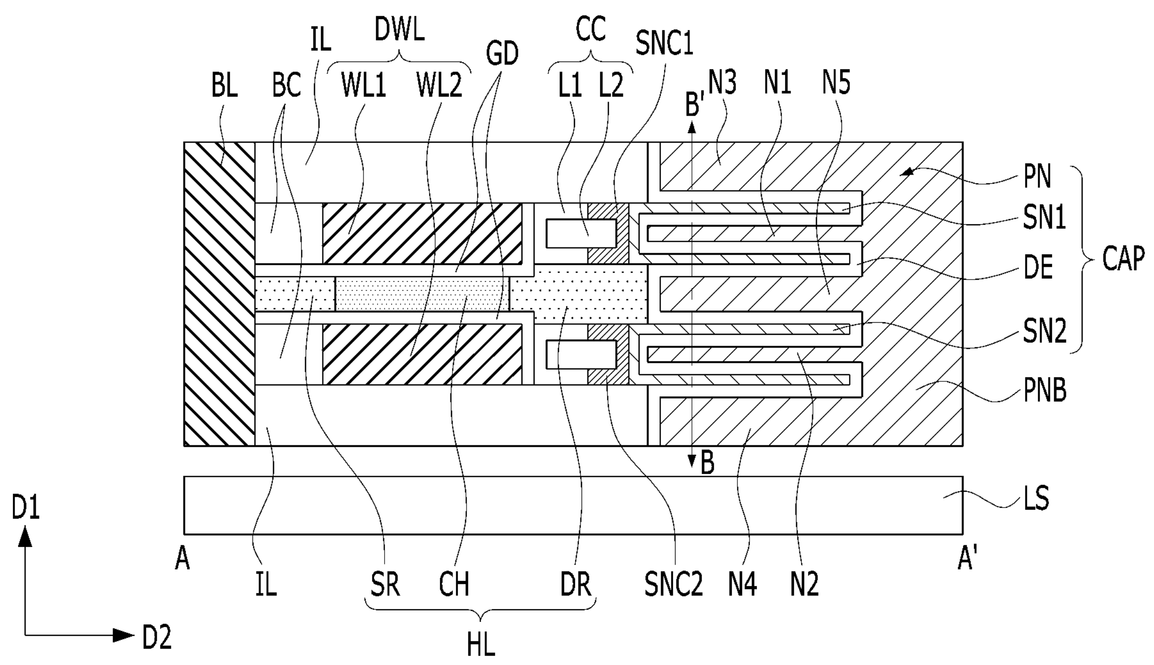
FIG. 1B is a schematic cross-sectional view taken along a line A-A' in FIG. 1A.
Figure 1C:
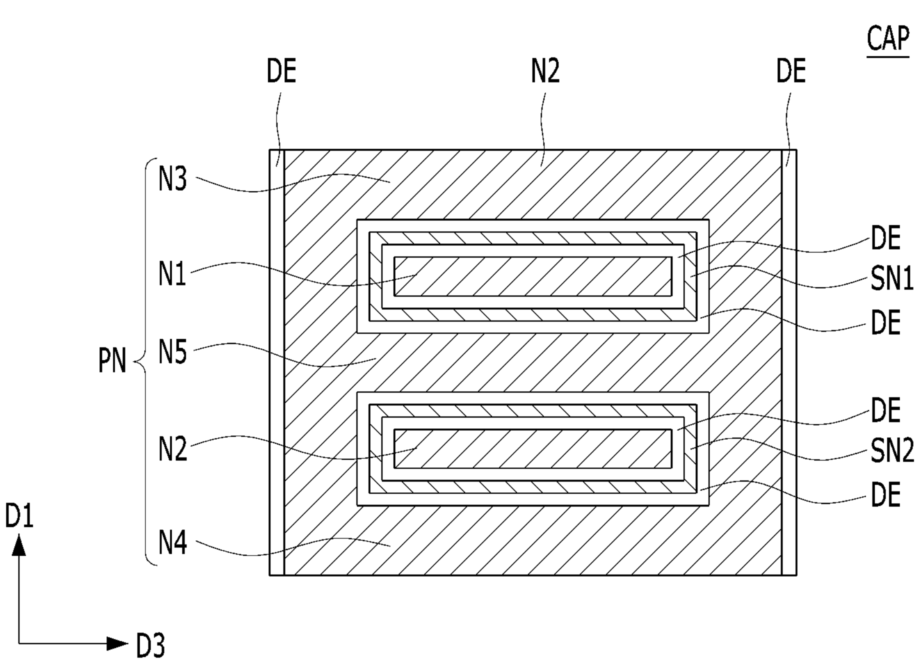
FIG. 1C is a schematic cross-sectional view taken along a line B-B' in FIG. 1B.
Figure 1D:
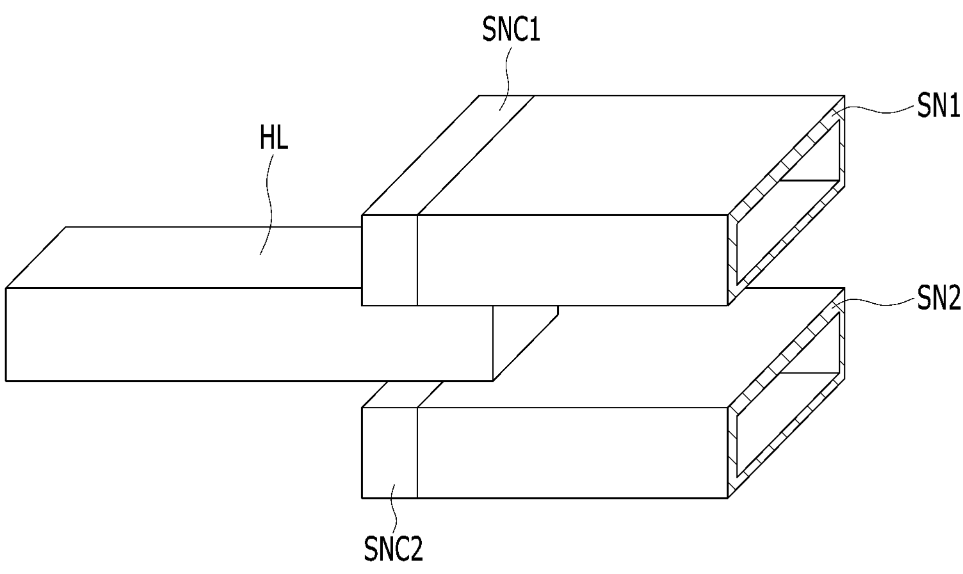
FIG. 1D is a schematic perspective view illustrating a dual cylinder structure of a first electrode SN.

FIG. 1A is a schematic perspective view illustrating a memory cell in accordance with an embodiment of the present invention. FIG. 1B is a schematic cross-sectional view taken along a line A-A' shown in FIG. 1A. FIG. 1C is a schematic cross-sectional view taken along a line B-B' shown in FIG. 1B. FIG. 1D is a schematic perspective view illustrating a dual cylinder structure of a first electrode SN.

Referring to FIGS. 1A to 1D, a memory cell MC may include a vertical conductive line BL, a switching element TR, and a data storage element CAP. The switching element TR may include a horizontal layer HL, a horizontal dielectric layer GD, and a horizontal conductive line DWL. The data storage element CAP may include a memory element, such as a capacitor. The vertical conductive line BL may include a bit line. The horizontal conductive line DWL may include a word line or a gate electrode, and the horizontal layer HL may include an active layer. The data storage element CAP may include a first electrode SN, a dielectric layer DE, and a second electrode PN. The switching element TR may include a transistor, and in this case, the horizontal conductive line DWL may serve as a gate electrode. The switching element TR may also be referred to as an access element or a selection element.

The vertical conductive line BL may extend vertically in a first direction D1. The horizontal layer HL may extend in a second direction D2 crossing the first direction D1. The horizontal conductive line DWL may extend in a third direction D3 crossing the first and second directions D1 and D2.

The vertical conductive line BL may be vertically oriented in the first direction D1. The vertical conductive line BL may be referred to as a vertically-oriented bit line, a vertically-extending bit line, or a pillar-shaped bit line. The vertical conductive line BL may include a conductive material. The vertical conductive line BL may include a silicon-based material, a metal-based material, or a combination thereof. The vertical conductive line BL may include, for example, polysilicon, a metal, a metal nitride, a metal silicide, or a combination thereof. The vertical conductive line BL may include, for example, polysilicon, titanium nitride, tungsten, or a combination thereof. For example, the vertical conductive line BL may include polysilicon or titanium nitride (TiN) that is doped with an N-type impurity. The vertical conductive line BL may include a stack (TiN/W) of titanium nitride and tungsten.

The switching element TR may include a transistor, and thus, the horizontal conductive line DWL may be referred to as a horizontal gate line or a horizontal word line. The horizontal conductive line DWL may have a double structure. For example, the horizontal conductive line DWL may include first and second horizontal conductive lines WL1 and WL2 that are facing each other with the horizontal layer HL interposed therebetween. A horizontal dielectric layer GD may be formed on the upper and lower surfaces of the horizontal layer HL. The first horizontal conductive line WL1 may be disposed over the horizontal layer HL, and the second horizontal conductive line WL2 may be disposed below the horizontal layer HL. The horizontal conductive line DWL may include a pair of the first horizontal conductive line WL1 and the second horizontal conductive line WL2. In the horizontal conductive line DWL, the first horizontal conductive line WL1 and the second horizontal conductive line WL2 may have the same potential. For example, the first horizontal conductive line WL1 and the second horizontal conductive line WL2 may form a pair to be coupled to one memory cell MC. The same driving voltage may be applied to the first horizontal conductive line WL1 and the second horizontal conductive line WL2.

The horizontal conductive line DWL may extend in the third direction D3, and the horizontal layer HL may extend in the second direction D2. The horizontal layer HL may be horizontally arranged from the vertical conductive line BL.

The horizontal layer HL may extend in the second direction D2. The horizontal layer HL may include a semiconductor material. For example, the horizontal layer HL may include, for example, polysilicon, monocrystalline silicon, germanium, or silicon-germanium. According to another embodiment of the present invention, the horizontal layer HL may include an oxide semiconductor material. For example, the oxide semiconductor material may include indium gallium zinc oxide (IGZO).

The horizontal layer HL may include a channel CH, a first doped region SR between the channel CH and the vertical conductive line BL, and second doped region DR between the channel CH and the data storage element CAP. When the horizontal layer HL is formed of an oxide semiconductor material, the channel CH may be formed of an oxide semiconductor material, and the first and second doped regions SR and DR may be omitted. The horizontal layer HL may also be referred to as an active layer or a thin-body.

The first doped region SR and the second doped region DR may be doped with impurities of the same conductivity type. The first doped region SR and the second doped region DR may be doped with N-type impurities or P-type impurities. The first doped region SR and the second doped region DR may include at least one impurity selected among arsenic (As), phosphorus (P), boron (B), indium (In), and combinations thereof. The first doped region SR may be in coupled with the vertical conductive line BL, and the second doped region DR may be in coupled with the first electrode SN of the data storage element CAP. A portion of the second doped region DR may be thicker than the first doped region SR and the channel CH.

The horizontal dielectric layer GD may include a gate dielectric layer. The horizontal dielectric layer GD may be formed of silicon oxide, silicon nitride, a metal oxide, a metal oxynitride, a metal silicate, a high-k material, a ferroelectric material, or an anti-ferroelectric material, or a combination thereof. The horizontal dielectric layer GD may include $SiO_2$, $Si_3N_4$, $HfO_2$, $Al_2O_3$, $ZrO_2$, AlON, HfON, HfSiO, HfSiON, or a combination thereof.

The horizontal conductive line DWL may include a metal, a metal mixture, a metal alloy, or a semiconductor material. The horizontal conductive line DWL may include titanium nitride, tungsten, molybdenum, ruthenium, polysilicon, or a combination thereof. For example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of approximately 4.5 eV or less, and the P-type work function material may have a high work function of approximately 4.5 eV or more.

Each of the first and second horizontal conductive lines WL1 and WL2 may have a dual work function structure. In the dual work function structure, a low work function material and a high work function material may be horizontally disposed. For example, the dual work function structure may be a metal-polysilicon (MP) structure in which the first and second horizontal conductive lines WL1 and WL2 are horizontally disposed in the second direction D2. The MP structure may refer to a structure in which metal and polysilicon are horizontally disposed. In the MP structure, polysilicon may be N-type dopant-doped polysilicon. The N-type dopant may include phosphorus or arsenic. The metal in the MP structure may include titanium nitride, tungsten, or a combination thereof. Polysilicon may be a low work function material, and metal may be a high work function material.

The data storage element CAP may be horizontally disposed in the second direction D2 from the switching element TR. The data storage element CAP may include a first electrode SN extending horizontally from the horizontal layer HL in the second direction D2. The data storage element CAP may further include a second electrode PN over the first electrode SN, and a dielectric layer DE between the first electrode SN and the second electrode PN. The first electrode SN, the dielectric layer DE, and the second electrode PN may be horizontally arranged in the second direction D2. The first electrode SN may have a horizontally oriented cylinder-shape. The dielectric layer DE may conformally cover the inner wall and the outer wall of the cylinder of the first electrode SN. The second electrode PN may cover the cylindrical inner wall and the cylindrical outer wall of the first electrode SN over the dielectric layer DE. The first electrode SN may be electrically connected to the second source/drain region DR.

The first electrode SN may have a 3D structure, and the first electrode SN of the 3D structure may have a horizontal 3D structure which is oriented in the second direction D2. As an example of the 3D structure, the first electrode SN may have a cylinder shape. According to another embodiment of the present invention, the first electrode SN may have a pillar shape or a pylinder shape. The pylinder shape may refer to a structure in which a pillar shape and a cylinder shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inside of the cylinder of the first electrode SN, and titanium nitride (TIN) may serve as the second electrode PN of the data storage element CAP, and tungsten nitride may be a low-resistance material.

The dielectric layer DE may be referred to as a capacitor dielectric layer or a memory layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or greater. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material.

The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, an interface control layer for improving leakage current may be further formed between the first electrode SN and the dielectric layer DE. The interface control layer may include titanium oxide ($TiO_2$), tantalum oxide ($Ta_2O_5$), or niobium oxide ($Nb_2O_5$). The interface control layer may also be formed between the second electrode PN and the dielectric layer DE.

The data storage element CAP may include a Metal-Insulator-Metal (MIM) capacitor. The first electrode SN and the second electrode PN may include a metal-based material.

The data storage element CAP may be replaced with other data storage materials. For example, the data storage material may be a phase change material, a magnetic tunnel junction (MTJ), or a variable resistance material.

Double contact nodes SNC1 and SNC2 may be formed between the second doped region DR and the first electrode SN. The double contact nodes SNC1 and SNC2 may include polysilicon that is doped with an N-type dopant. The second doped region DR may include dopants that are diffused from the double contact nodes SNC1 and SNC2.

The double contact nodes SNC1 and SNC2 may include a first contact node SNC1 and a second contact node SNC2. The first contact node SNC1 may be formed on the upper portion of the second doped region DR, and the second contact node SNC2 may be formed on the lower portion of the second doped region DR. The second doped region DR may be disposed between the first contact node SNC1 and the second contact node SNC2. The first contact node SNC1, the second contact node SNC2, and the second doped region DR may be electrically connected. The first and second contact nodes SNC1 and SNC2 may directly contact the first electrode SN of the data storage element CAP.

According to another embodiment of the present invention, an additional contact node may be formed between the first doped region SR and the vertical conductive line BL. The additional contact node may include polysilicon that is doped with an N-type dopant. The first doped region SR may include dopants that are diffused from the additional contact node.

A first capping layer BC may be disposed between the vertical conductive line BL and the horizontal conductive line DWL. A second capping layer CC may be disposed between the double contact nodes SNC1 and SNC2 and the horizontal conductive line DWL. The first and second capping layers BC and CC may include a dielectric material. The first and second capping layers BC and CC may include silicon oxide, silicon nitride, SiCN, SiCO, SiCON, or a combination thereof. The second capping layer CC may include a stack of a first liner L1 and a second liner L2. The first liner L1 may be silicon oxide, and the second liner L2 may be silicon nitride. The second liner L2 may be disposed between the first liner L1 and the double contact nodes SNC1 and SNC2. The double contact nodes SNC1 and SNC2 may include inner surfaces contacting the second liner L2. The double contact nodes SNC1 and SNC2 may further include outer side surfaces contacting the first electrode SN. The first liner L1 may include inner surfaces contacting the second liner L2. The first liner L1 may further include outer side surfaces contacting the horizontal dielectric layer GD.

The data storage element CAP will be described in detail with reference to FIGS. 1B to 1D again.

The first electrode SN of the data storage element CAP may include a dual cylinder. The dual cylinder including a first cylinder SN1 and a second cylinder SN2. The first and second cylinders SN1 and SN2 may have a cylinder shape, however, the invention may not be limited in this way. For example, cylinder shape may include a cylinder having a rectangular cross-section or a circular, or oval cross-section. The first cylinder SN1 may be in contact with an edge of the upper surface of the second doped region DR, and the second cylinder SN2 may be in contact with an edge of the lower surface of the second doped region DR. The second doped region DR may be disposed between the first cylinder SN1 and the second cylinder SN2. The first cylinder SN1 may be in contact with the first contact node SNC1, and the second cylinder SN2 may be in contact with the second contact node SNC2.

The second electrode PN of the data storage element CAP may include a plurality of segments. For example, the second electrode PN may include an electrode body PNB having a generally rectangular cross-section and spaced apart protruding elements (portions) including a first inner portion N1, a second inner portion N2, an upper outer portion N3, a lower outer portion N4, and a sharing portion N5. The first inner portion N1, the second inner portion N2, the upper outer portion N3, the lower outer portion N4, and the sharing portion N5 may extend horizontally from the electrode body PNB in the second direction D2 in a direction toward the vertical conductive line BL. The first inner portion N1, the second inner portion N2, the upper outer portion N3, the lower outer portion N4, and the sharing portion N5 may have an elongated, rectangular prism profile with generally flat ends and a constant rectangular cross-sectional area along their length.

The electrode body PNB may be in contact in common to the first inner portion N1, the second inner portion N2, the upper outer portion N3, the lower outer portion N4, and the sharing portion N5. The electrode body PNB, the first inner portion N1, the second inner portion N2, the upper outer portion N3, the lower outer portion N4, and the sharing portion N5 may be integrated.

The first inner portion N1 may be disposed on the inner surface of the first cylinder SN1, and the second inner portion N2 may be disposed on the inner surface of the second cylinder SN2. The upper outer portion N3 may be disposed over the first cylinder SN1, and the lower outer portion N4 may be disposed below the second cylinder SN2. The upper outer portion N3 may be disposed at a higher level than the first cylinder SN1, and the lower outer portion N4 may be disposed at a lower level than the second cylinder SN2. The sharing portion N5 may be disposed in a gap between the first cylinder SN1 and the second cylinder SN2. The sharing portion N5 may be a part that is shared in common by the first cylinder SN1 and the second cylinder SN2. As to the vertical thickness in the first direction D1, the first inner portion N1 and the second inner portion N2 may be thinner than the upper outer portion N3, the lower outer portion N4, and the sharing portion N5. According to another embodiment of the present invention, the first inner portion N1 and the second inner portion N2 may have the same vertical thickness as the thicknesses of the upper outer portion N3, the lower outer portion N4 and the sharing portion N5. According to another embodiment of the present invention, the first inner portion N1 and the second inner portion N2 may have a greater vertical thickness than the upper outer portion N3, the lower outer portion N4, and the sharing portion N5.

The first contact node SNC1, the second contact node SNC2, and the second doped region DR may be electrically connected. The first and second contact nodes SNC1 and SNC2 may directly contact the first electrode SN of the data storage element CAP.

As described above, in the memory cell MC according to the embodiment of the present invention, the first electrode SN of the data storage element CAP may include dual cylinders SN1 and SN2. Since the dual cylinders SN1 and SN2 are formed, the storage capacity of the data storage element CAP may be increased without increasing the length of the cylinder.

Figure 2A:
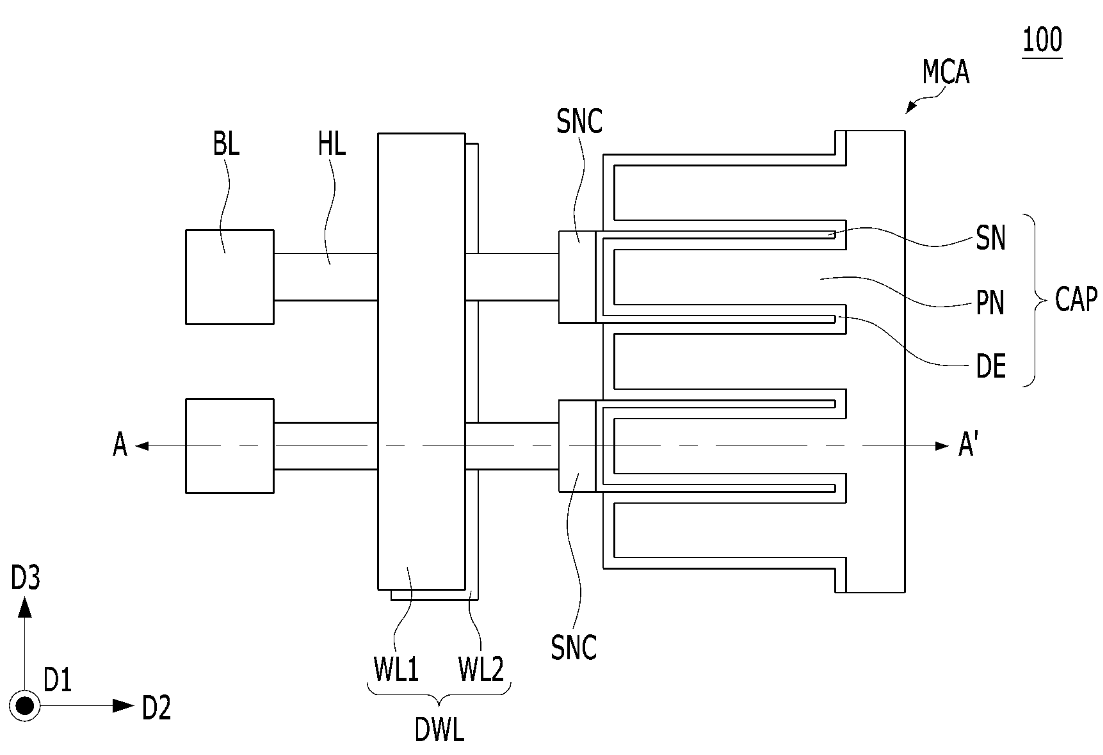
FIG. 2A is a schematic plan view illustrating a semiconductor device in accordance with another embodiment of the present invention.
Figure 2B:
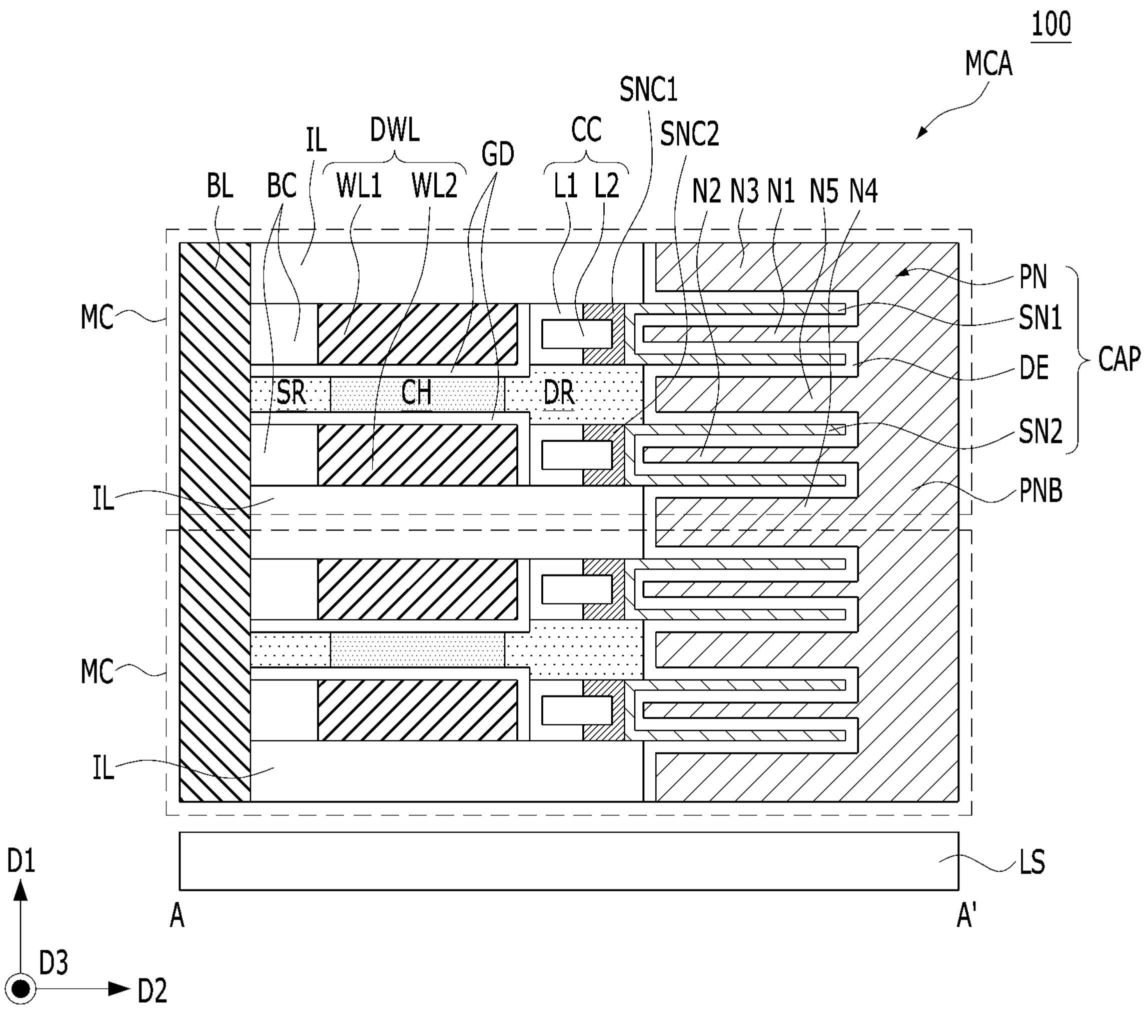
FIG. 2B is a cross-sectional view taken along a line A-A' of FIG. 2A.

FIG. 2A is a schematic plan view illustrating a semiconductor device 100 in accordance with another embodiment of the present invention. FIG. 2B is a cross-sectional view taken along a line A-A' of FIG. 2A.

Referring to FIGS. 2A and 2B, the semiconductor device 100 may include a lower structure LS and a memory cell array MCA. The memory cell array MCA may include a 3D array of memory cells MC. The 3D array of memory cells MC may include a column array of memory cells MC and a row array of memory cells MC. The column array of the memory cells MC may include a plurality of memory cells MC that are stacked in the first direction D1, and the row array of the memory cells MC may include a plurality of memory cells MC that are horizontally disposed in the third direction D3. According to some embodiments of the present invention, cell insulating layers may be disposed between the memory cells MC that are stacked in the first direction D1. The memory cells MC may correspond to the memory cells MC of FIGS. 1A and 1B.

Each memory cell MC may include a vertical conductive line BL, a switching element TR, and a data storage element CAP. Each switching element TR may be a transistor and may include a horizontal layer HL, a horizontal dielectric layer GD, and a horizontal conductive line DWL. Each horizontal layer HL may include a first doped region SR, a second doped region DR, and a channel CH between the first doped region SR and the second doped region DR. Each horizontal conductive line DWL may include a pair of a first horizontal conductive line WL1 and a second horizontal conductive line WL2. Each data storage element CAP may include a first electrode SN, a second electrode PN, and a dielectric layer DE between the first electrode SN and the second electrode PN.

The column array of the memory cells MC may include a plurality of switching elements TR that are stacked in the first direction D1, and the row array of the memory cells MC may include a plurality of switching elements TR that are disposed horizontally in the third direction D3.

The horizontal layers HL may be stacked over the lower structure LS in the first direction D1, and the horizontal layers HL may be spaced apart from the lower structure LS to extend in the second direction D2, which is parallel to the surface of the lower structure LS.

The vertical conductive line BL may extend in the first direction D1, which is perpendicular to the surface of the lower structure LS, and the vertical conductive line BL may be in contact to first-side ends of the horizontal layers HL.

The data storage elements CAP may be in contact to second-side ends of the horizontal layers HL, respectively.

The horizontal conductive lines DWL may be stacked over the lower structure LS in the first direction D1, and the horizontal conductive lines DWL may be spaced apart from the lower structure LS to extend in the third direction D3, which is parallel to the surface of the lower structure LS.

The second electrodes PN of the data storage elements CAP may be merged with each other. The horizontal layers HL of the switching elements TR disposed horizontally in the third direction D3 may share one horizontal conductive line DWL. Also, the horizontal layers HL of the switching elements TR disposed horizontally in the third direction D3 may be in contact to different vertical conductive lines BL. The switching elements TR stacked in the first direction D1 may share one vertical conductive line BL. The switching elements TR disposed horizontally in the third direction D3 may share one horizontal conductive line DWL.

The lower structure LS may include a semiconductor substrate or a peripheral circuit unit. The lower structure LS may be disposed at a lower level than the memory cell array MCA. This may be referred to as a COP (Cell-Over-Peripheral) structure. The peripheral circuit unit may include at least one control circuit for driving the memory cell array MCA. The at least one control circuit of the peripheral circuit unit may include an N-channel transistor, a P-channel transistor, a CMOS circuit, or a combination thereof. The at least one control circuit of the peripheral circuit unit may include an address decoder circuit, a read circuit, a write circuit, and the like. The at least one control circuit of the peripheral circuit unit may include a planar channel transistor, a recess channel transistor, a buried gate transistor, a fin channel transistor (FinFET), and the like.

For example, the peripheral circuit unit may include sub-word line drivers and a sense amplifier. The horizontal conductive lines DWL may be in contact with the sub-word line drivers. The vertical conductive line BL may be in contact with the sense amplifier.

According to another embodiment of the present invention, the peripheral circuit unit may be disposed at a higher level than the memory cell array MCA. This may be referred to as a POC (Peripheral-Over-Cell) structure.

The memory cell array MCA may include a plurality of horizontal conductive lines DWL that are stacked in the first direction D1. Each of the horizontal conductive lines DWL may include a pair of a first horizontal conductive line WL1 and a second horizontal conductive line WL2.

Each of the first electrodes SN of the data storage elements CAP may include a dual cylinder, that is, a first cylinder SN1 and a second cylinder SN2. Each of the second electrodes PN of the data storage elements CAP may include an electrode body PNB, a first inner portion N1, a second inner portion N2, an upper outer portion N3, a lower outer portion N4, and a sharing portion N5. The first inner portion N1, the second inner portion N2, the upper outer portion N3, the lower outer portion N4, and the sharing portion N5 may extend horizontally from the electrode body PNB in the second direction D2.

Double contact nodes SNC1 and SNC2 may be formed between the first electrode SN and the horizontal conductive line DWL. A second capping layer CC may be disposed between the double contact nodes SNC1 and SNC2 and the horizontal conductive line DWL. The second capping layer CC may include a first liner L1 and a second liner L2. A first capping layer BC may be disposed between the vertical conductive line BL and the horizontal conductive line DWL.

FIGS. 3 to 19 illustrate an example of a method for fabricating a semiconductor device in accordance with embodiments of the present invention.

Figure 3:
FIGS. 3 to 19 are cross-sectional views illustrating an example of a method for fabricating a semiconductor device in accordance with an embodiment of the present invention.

Referring to FIG. 3, the stack body 20 may be formed over the lower structure 11. In the stack body 20, a first dielectric layer 21, a first sacrificial layer 22, a semiconductor layer 23, a second sacrificial layer 24, and a second dielectric layer 25 may be stacked in the mentioned order. As a cell separation layer (or cell insulating layer) of the first dielectric layer 21 and the second dielectric layer 25, a dielectric material, for example, silicon oxide, may be included. The first sacrificial layer 22 and the second sacrificial layer 24 may include a dielectric material, for example, silicon nitride. The semiconductor layer 23 may include, for example, polysilicon, monocrystalline silicon, or an oxide semiconductor. In an embodiment, the stack body 20 may include an ONSNO (Oxide-Nitride-Silicon-Nitride-Oxide) stack. According to an embodiment, the forming of the ONSNO stack may include forming a plurality of SiGe/Si stacks by an epitaxial growth process and replacing each of the SiGe/Si stacks with an ONSNO stack. The SiGe/Si stacks may include a first SiGe/Si/SiGe stack, a monocrystalline silicon layer, and a second SiGe/Si/SiGe stack, and the first and second SiGe/Si/SiGe stacks may be replaced with first and second ON (Oxide-Nitride) stacks, respectively, and the monocrystalline silicon layer may be thinned. The replaced first ON stack may include a stack of the first dielectric layer 21 and the first sacrificial layer 22, and the replaced second ON stack may include a second sacrificial layer 24 and a second dielectric layer 25. The thinned monocrystalline silicon layer may include a semiconductor layer 23.

Figure 4:
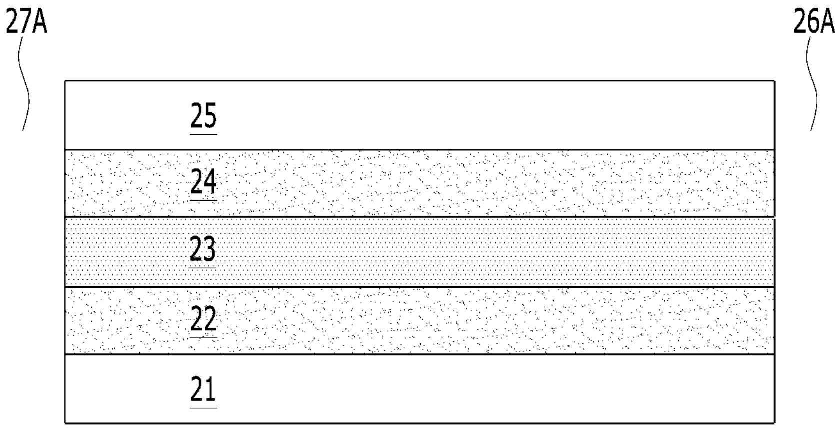

Referring to FIG. 4, a first opening 26A and a second opening 27A may be formed by etching respective sections of the stack body SB. The first opening 26A and the second opening 27A may extend vertically from the surface of the lower structure 11.

Figure 5:
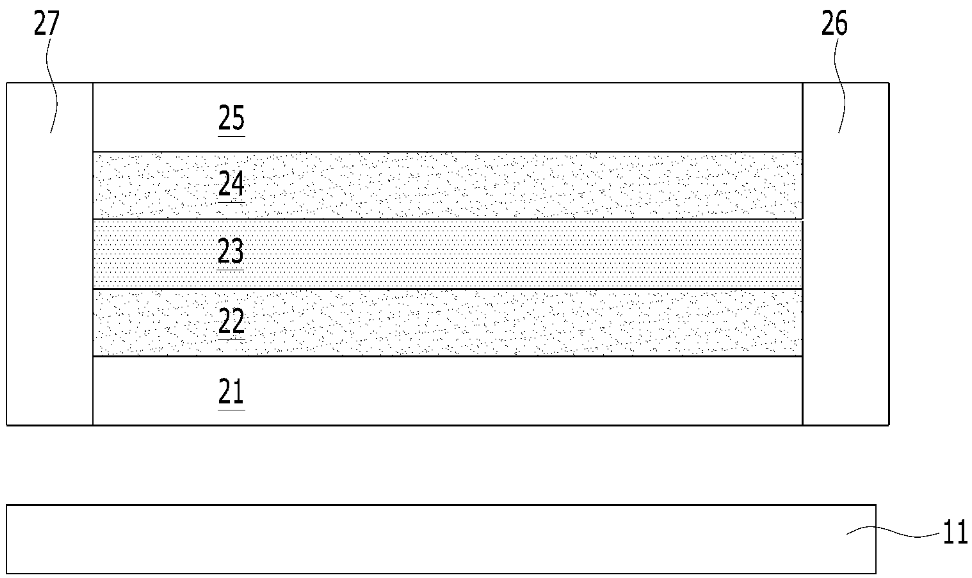

Referring to FIG. 5, a first sacrificial structure 26 filling the first opening 26A and a second sacrificial structure 27 filling the second opening 27A may be formed. As a dielectric material, the first and second sacrificial structures 26 and 27 may include, for example, silicon oxide, silicon nitride, a carbon-containing material, or a combination thereof. The first and second sacrificial structures 26 and 27 may include a dielectric material and a metal material embedded in the dielectric material.

Figure 6:
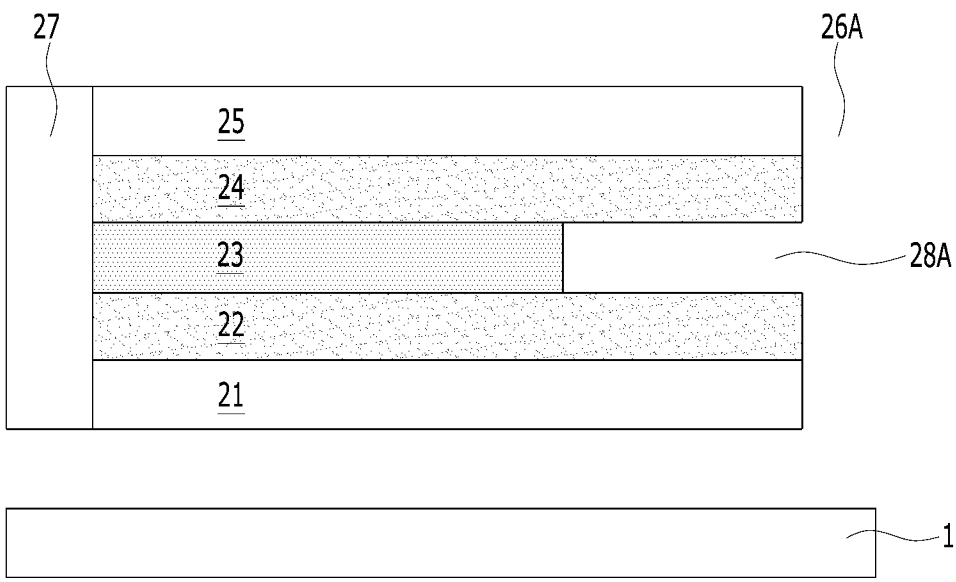

Referring to FIG. 6, the first opening 26A may be opened again. To open the first opening 26A, the first sacrificial structure 26 may be selectively removed.

Subsequently, a first side of the semiconductor layer 23 exposed by the first opening 26A may be selectively etched. As a result, a semiconductor layer-level recess 28A may be formed between the first sacrificial layer 22 and the second sacrificial layer 24.

Figure 7:
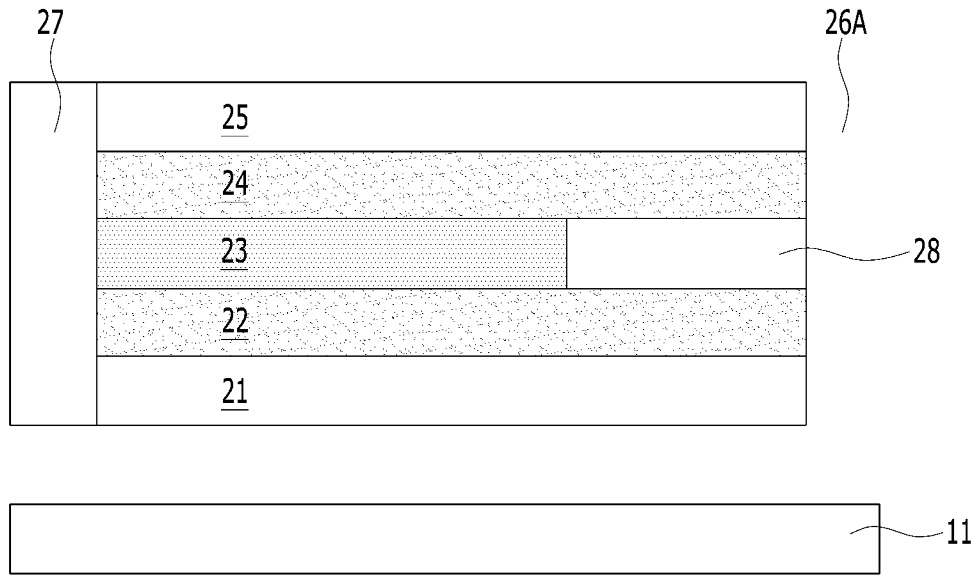

Referring to FIG. 7, a semiconductor layer-level sacrificial layer 28 filling the semiconductor layer-level recess 28A may be formed. The semiconductor layer-level sacrificial layer 28 may have an etch selectivity with respect to the first sacrificial layer 22 and the second sacrificial layer 24. The semiconductor layer-level sacrificial layer 28 may be formed of the same material as those of the first and second dielectric layer 21 and 25. The semiconductor layer-level sacrificial layer 28 may include a dielectric material, for example, silicon oxide.

Figure 8:
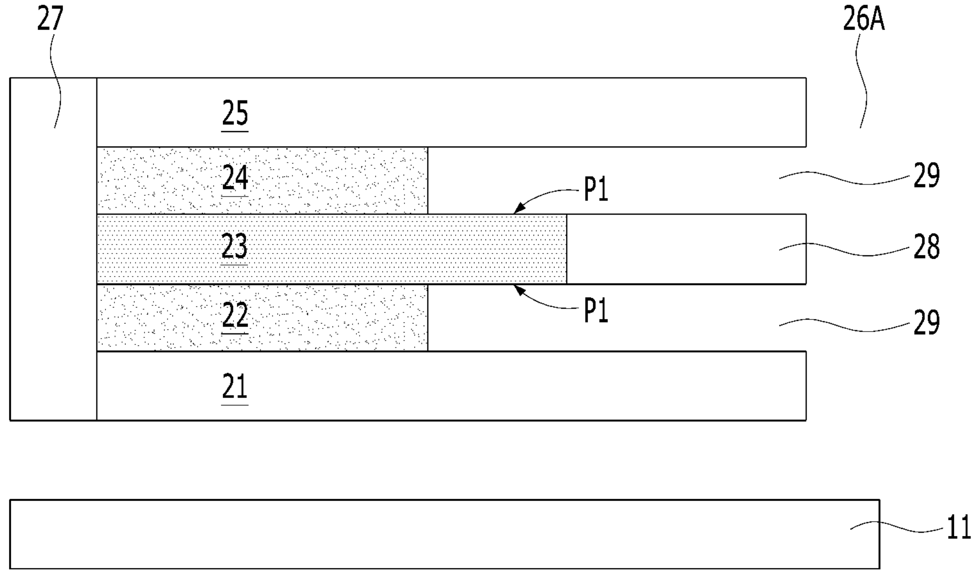

Referring to FIG. 8, the first and second sacrificial layers 22 and 24 may be selectively removed through the first opening 26A. As a result, sacrificial layer-level recesses 29 exposing the upper and lower surfaces of a first portion p1 of the semiconductor layer 23 may be formed. The sacrificial layer-level recesses 29 may expose the upper and lower surfaces of the semiconductor layer-level sacrificial layer 28.

Figure 9:
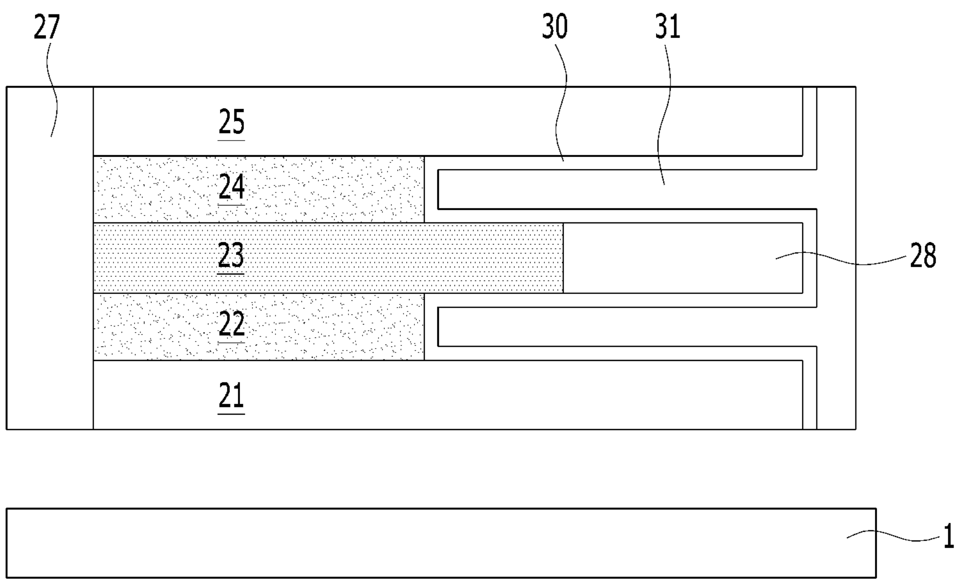

Referring to FIG. 9, a first liner layer 30 may be conformally formed over the sacrificial layer-level recesses 29. A second liner layer 31 may be formed over the first liner layer 30. In an embodiment, for example, the first liner layer 30 may include silicon oxide, and the second liner layer 31 may include silicon nitride. The second liner layer 31 may fill the sacrificial layer-level recesses 29 over the first liner layer 30.

Figure 10:
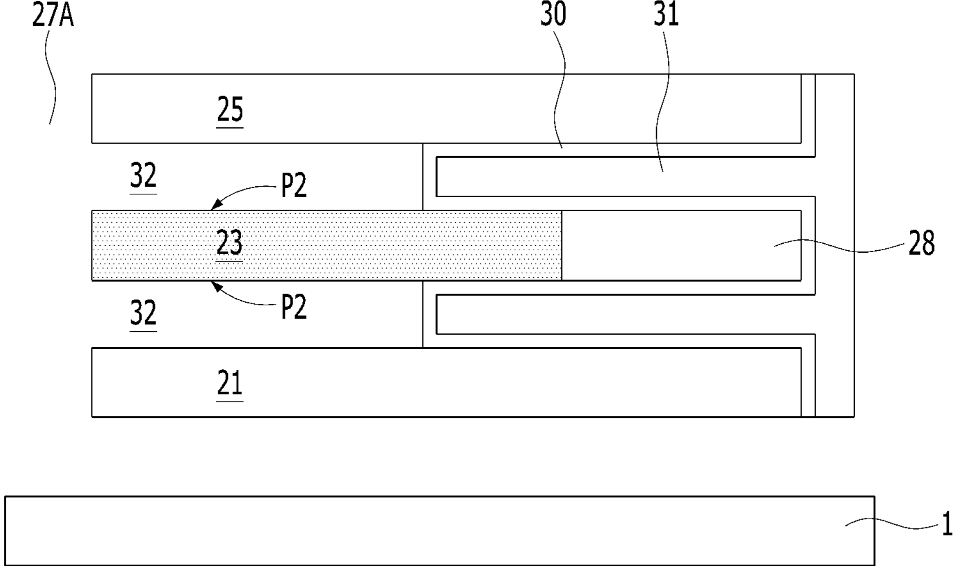

Referring to FIG. 10, the second opening 27A may be exposed again by selectively removing the second sacrificial structure 27.

Subsequently, the first and second sacrificial layers 22 and 24 may be selectively removed through the second opening 27A. As a result, gate-level recesses 32 exposing the upper and lower surfaces of a second portion P2 of the semiconductor layer 23 may be formed. The gate-level recesses 32 may have a double structure, and the gate-level recesses 32 may be disposed between the semiconductor layer 23 and the first dielectric layer 21 and between the semiconductor layer 23 and the second dielectric layer 25.

Figure 11:
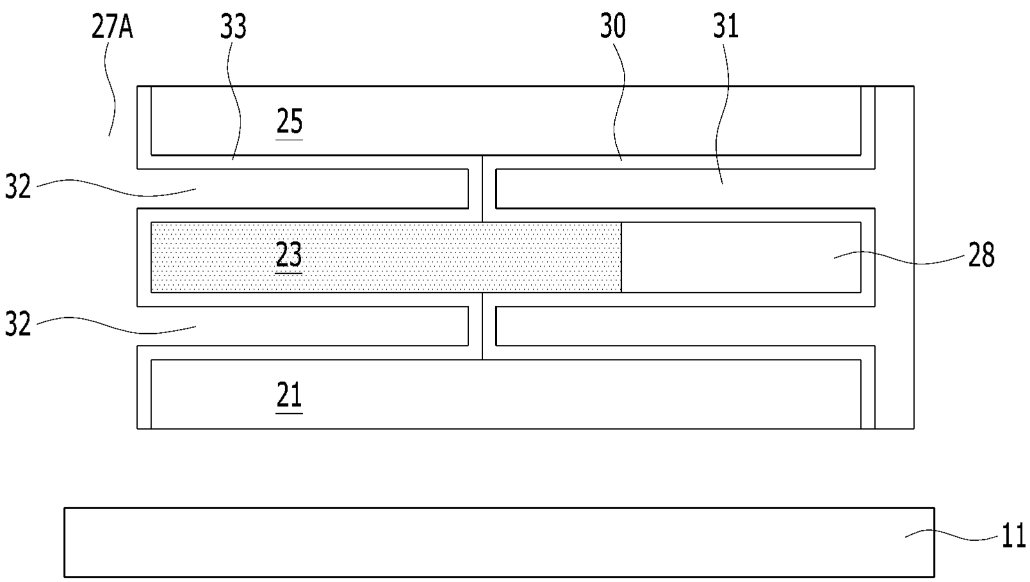

Referring to FIG. 11, a horizontal dielectric layer 33 may be conformally formed over the gate-level recesses 32. The horizontal dielectric layer 33 may be referred to as a gate dielectric layer. The horizontal dielectric layer 33 may be formed of silicon oxide, silicon nitride, a metal oxide, a metal oxynitride, a metal silicate, a high-k material, a ferroelectric material, an anti-ferroelectric material, or a combination thereof. The horizontal dielectric layer 33 may include $SiO_2$, $Si_3N_4$, $HfO_2$, $Al_2O_3$, $ZrO_2$, AlON, HfON, HfSiO, HfSiON, or a combination thereof.

According to this embodiment of the present invention, the horizontal dielectric layer 33 may be formed by a deposition process or an oxidation process.

Figure 12:
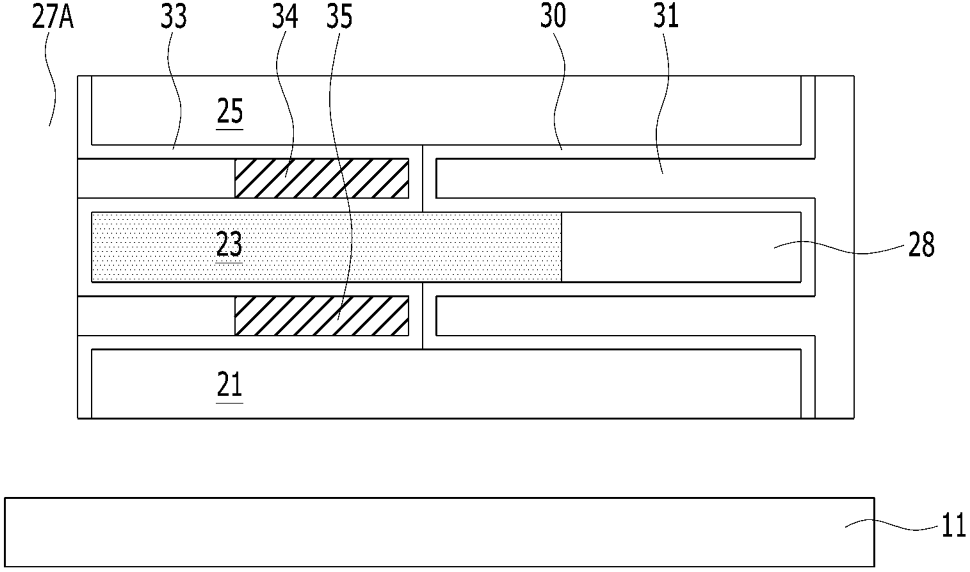

Referring to FIG. 12, the horizontal conductive lines 34 and 35 of a double structure partially filling the gate-level recesses 32 may be formed over the horizontal dielectric layer 33. The horizontal conductive lines 34 and 35 may be formed by depositing a conductive material and performing an etching process. The horizontal conductive lines 34 and 35 may include, for example, polysilicon, metal, a metal nitride, or a combination thereof. The horizontal conductive lines 34 and 35 may include a low work function material, a high work function material, or a combination thereof. The horizontal conductive lines 34 and 35 of the double structure may correspond to the horizontal conductive lines DWL as described with reference to in FIGS. 1A to 2B. The horizontal conductive line 34 may correspond to the first horizontal conductive line WL1, and the horizontal conductive line 35 may correspond to the second horizontal conductive line WL2.

Figure 13:
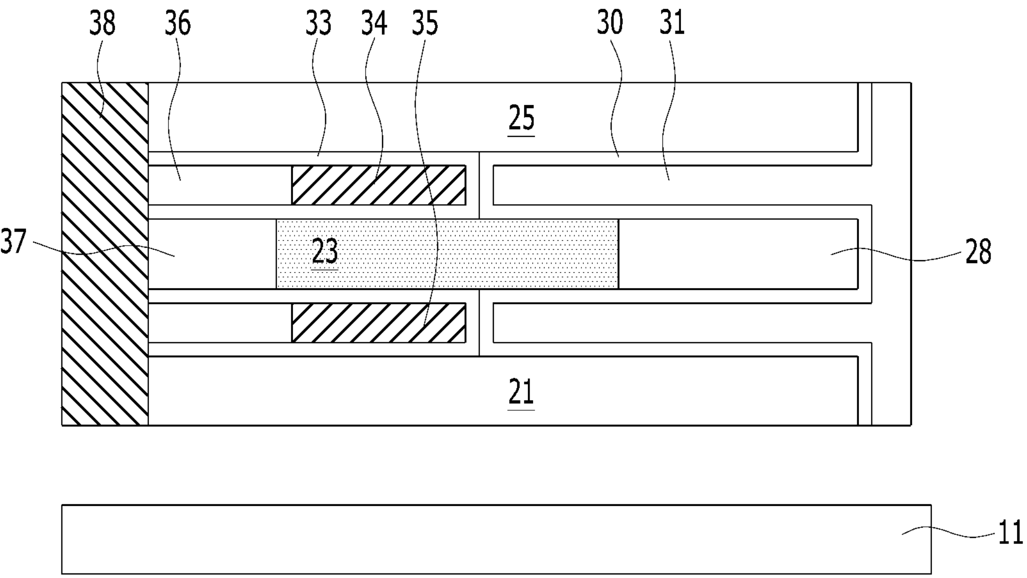

Referring to FIG. 13, a first capping layer 36 may be formed over the horizontal conductive lines 34 and 35. The first capping layer 36 may include a dielectric material. The first capping layer 36 may include silicon oxide, silicon nitride, SiCN, SiCO, SiCON, or a combination thereof.

Subsequently, a vertical conductive line 38 in contact with the second portion P2 of the semiconductor layer 23 may be formed. The vertical conductive line 38 may include titanium nitride, tungsten, or a combination thereof.

Prior to forming the vertical conductive line 38, a first doped region 37 may be formed in the second portion P2 of the semiconductor layer 23. The first doped region 37 may be formed by an impurity doping process. According to another embodiment of the present invention, a first doped region 37 may be formed by depositing doped polysilicon and performing a subsequent heat treatment.

First capping layers 36 may be disposed between the vertical conductive line 38 and the horizontal conductive lines 34 and 35.

Figure 14:
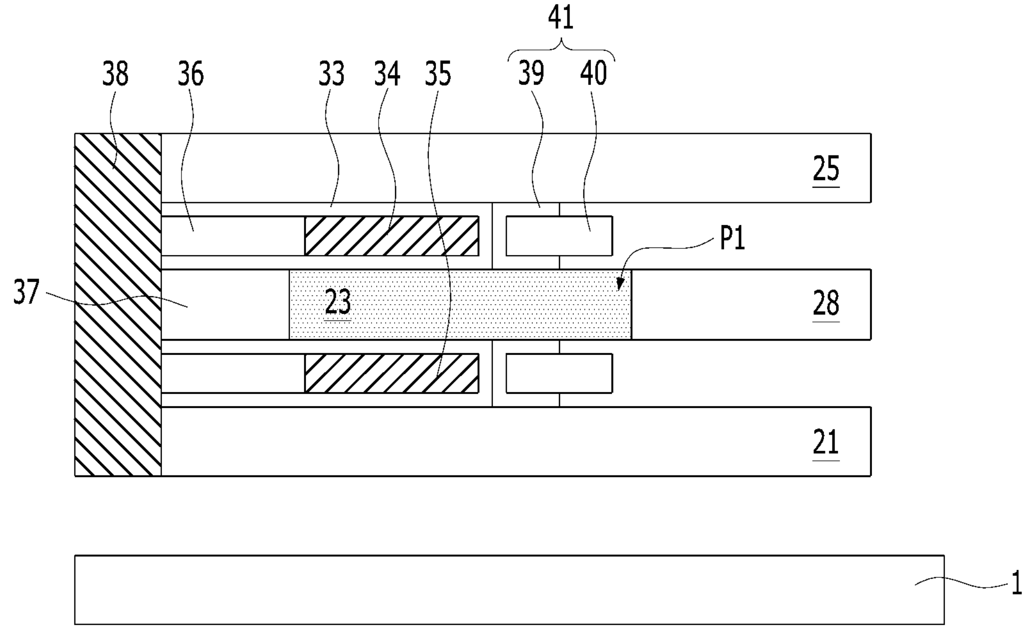

Referring to FIG. 14, the first and second liner layers 30 and 31 may be selectively recessed to form the second capping layer 41. The second capping layer 41 may include a first liner 39 and a second liner 40. The first liner 39 may be formed by recessing the first liner layer 30, and the second liner 40 may be formed by recessing the second liner layer 31. For example, after the second liner layer 31 is horizontally recessed, the first liner layer 30 may be horizontally recessed.

The second liner 40 may include protrusions that are not covered by the first liner 39.

As the first and second liners 39 and 40 are formed, the semiconductor layer-level sacrificial layer 28 may be exposed. Also, the first portion P1 of the semiconductor layer 23 may be partially exposed.

Figure 15:
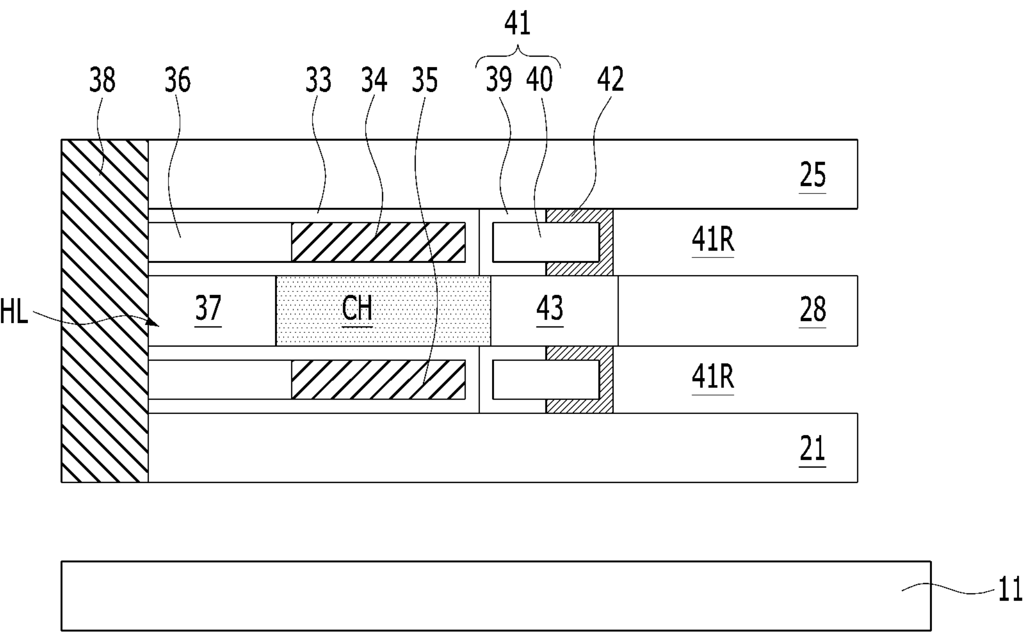

Referring to FIG. 15, a double contact node 42 contacting the second capping layer 41 and the first portion P1 of the semiconductor layer 23 may be formed. The double contact node 42 may contact the upper and lower surfaces of the first portion P1 of the semiconductor layer 23, respectively. The double contact node 42 may be formed by depositing doped polysilicon and recessing the doped polysilicon. The double contact node 42 may include an impurity.

Subsequently, a second doped region 43 may be formed in the semiconductor layer 23 by diffusing the impurity from the double contact node 42. A channel CH may be defined between the first doped region 37 and the second doped region 43. The semiconductor layer 23 may be a horizontal layer HL, and the horizontal layer HL may include the first doped region 37, the second doped region 43, and the channel CH between the first doped region 37 and the second doped region 43.

After the double contact node 42 is formed, a pair of capping layer-level recesses 41R may be formed. The upper and lower surfaces of the semiconductor layer-level sacrificial layer 28 may be exposed by the pair of the capping layer-level recesses 41R.

Figure 16:
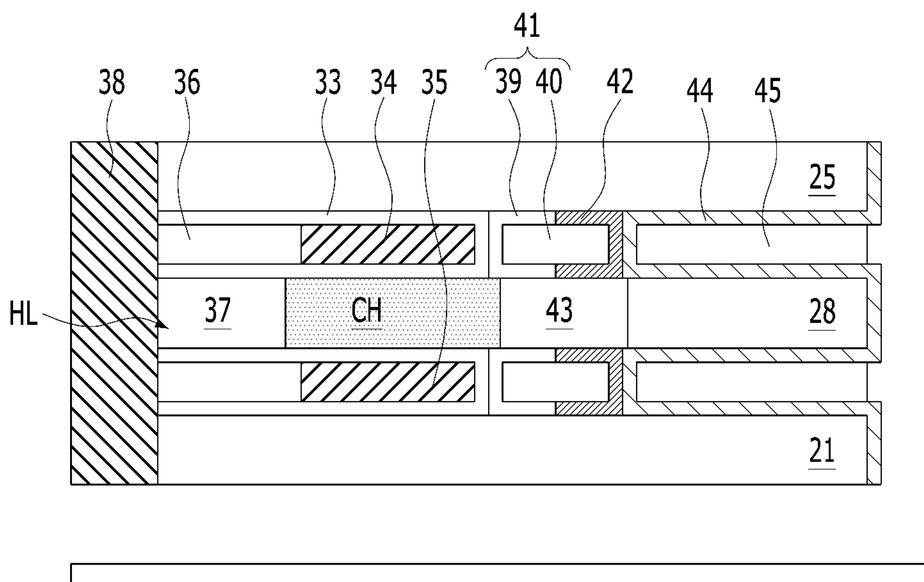

Referring to FIG. 16, an electrode material 44 may be conformally formed over the pair of the capping layer-level recesses 41R. An etch stopper 45 may be formed over the electrode material 44. The etch stopper 45 may fill the pair of the capping layer-level recesses 41R over the electrode material 44. The etch stopper 45 may include silicon oxide. The electrode material 44 may include a metal-based material, such as titanium nitride.

Figure 17:
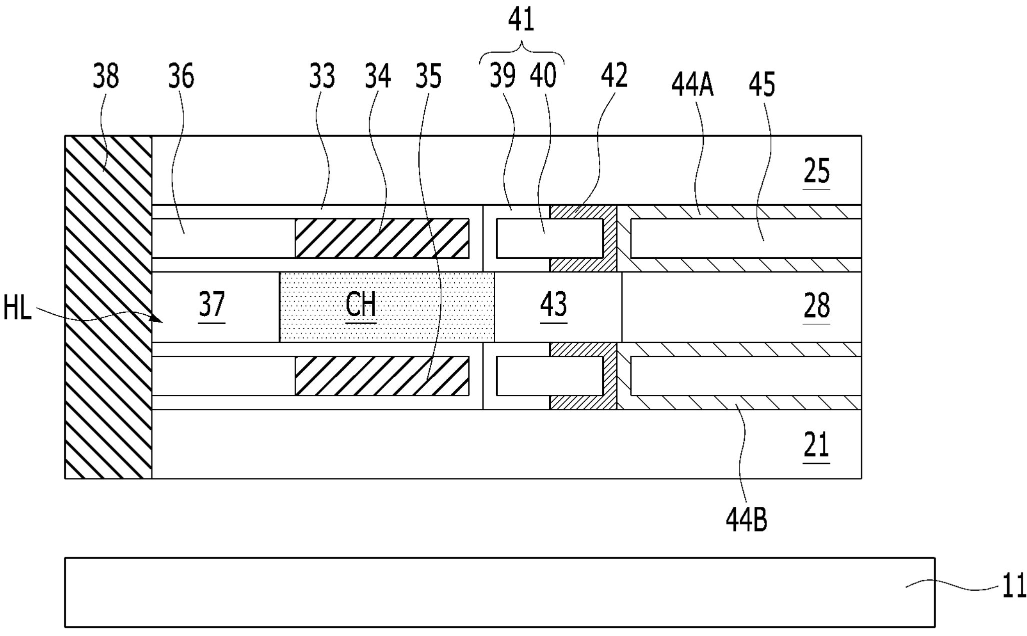

Referring to FIG. 17, the electrode material 44 may be selectively etched to form a first cylinder 44A and a second cylinder 44B. The first and second cylinders 44A and 44B may be electrically connected to the horizontal layer HL and the double contact node 42. The first and second cylinders 44A and 44B may be in contact with the second doped region 43 of the horizontal layer HL.

Subsequently, the etch stopper 45 may be removed.

Figure 18:
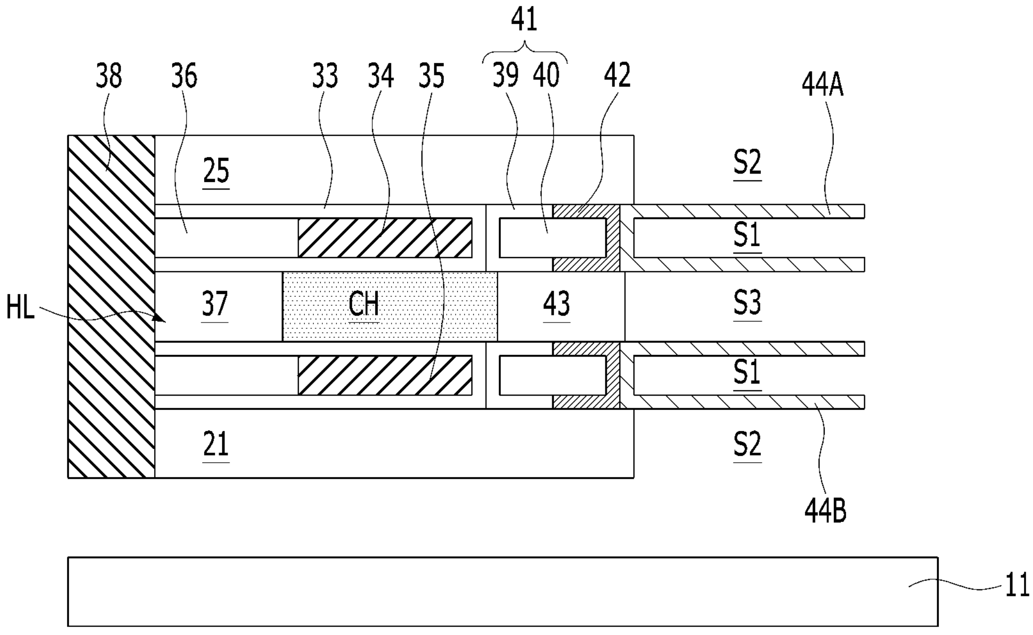

Referring to FIG. 18, the semiconductor layer-level sacrificial layer 28 may be selectively removed, and the first dielectric layer 21 and the second dielectric layer 25 may be partially recessed. As a result, both inner surfaces S1 and outer surfaces S2 of the first cylinder 44A and the second cylinder 44B may be exposed. A gap S3 may be formed between the first cylinder 44A and the second cylinder 44B, and the gap S3 may expose a side surface of the second doped region 43.

Figure 19:
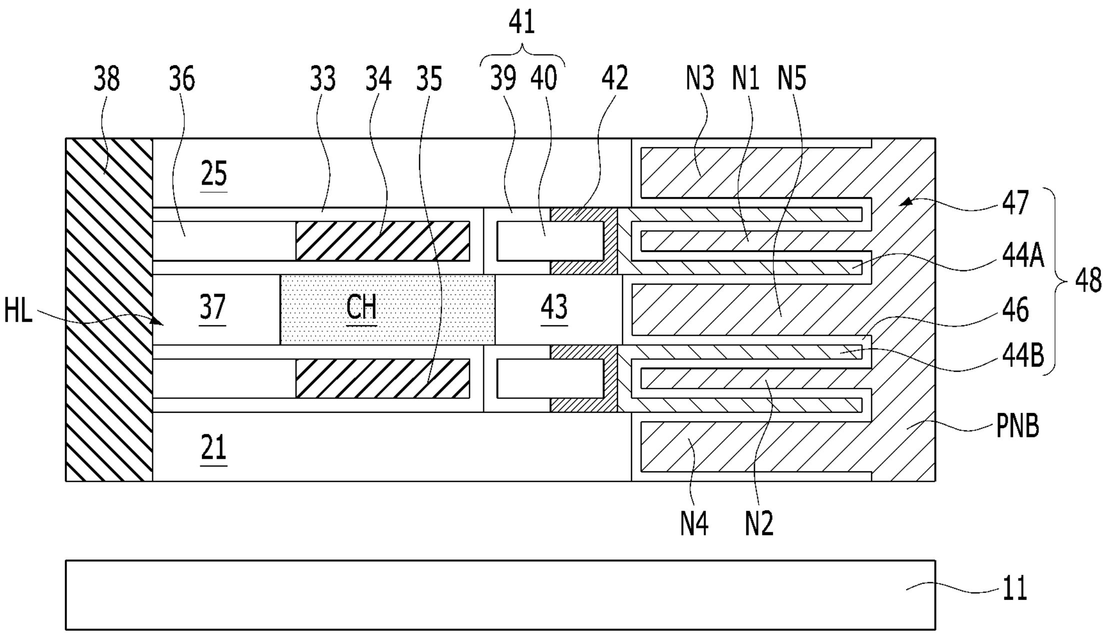

Referring to FIG. 19, a dielectric layer 46 and a second electrode 47 may be sequentially formed over the first and second cylinders 44A and 44B. The first and second cylinders 44A and 44B, the dielectric layer 46, and the second electrode 47 may form one data storage element 48.

The second electrode 47 may include an electrode body PNB, a first inner portion N1, a second inner portion N2, an upper outer portion N3, a lower outer portion N4, and a sharing portion N5. The electrode body PNB may be in contact in common to the first inner portion N1, the second inner portion N2, the upper outer portion N3, the lower outer portion N4, and the sharing portion N5. The electrode body PNB, the first inner portion N1, the second inner portion N2, the upper outer portion N3, the lower outer portion N4, and the sharing portion N5 may be integrated. The first inner portion N1 may be disposed on the inner surface of the first cylinder 44A, and the second inner portion N2 may be disposed on the inner surface of the second cylinder 44B. The upper outer portion N3 may be disposed over the first cylinder 44A, and the lower outer portion N4 may be disposed at a level below the second cylinder 44B. The upper outer portion N3 may be disposed at a higher level than the first cylinder 44A, and the lower outer portion N4 may be disposed at a lower level than the second cylinder 44B. The sharing portion N5 may be disposed in the gap between the first cylinder 44A and the second cylinder 44B.

Figure 20:
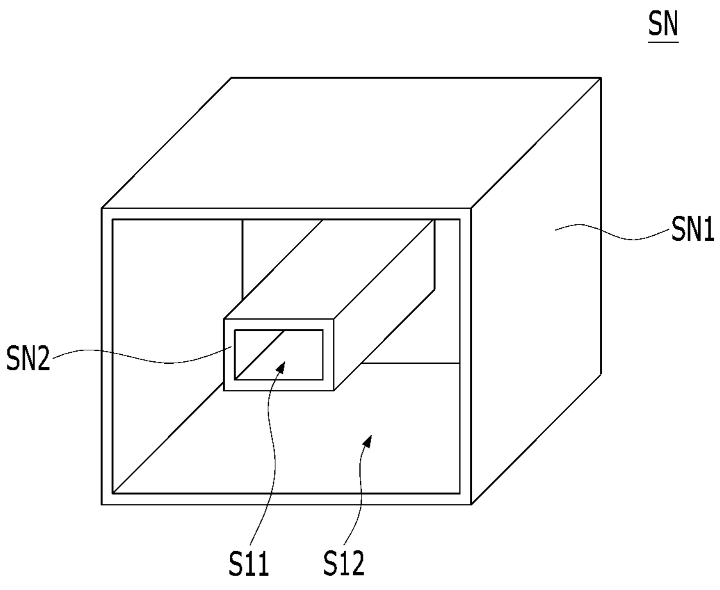
FIG. 20 is a perspective view illustrating a first electrode of a data storage element in accordance with another embodiment of the present invention.
Figure 21:
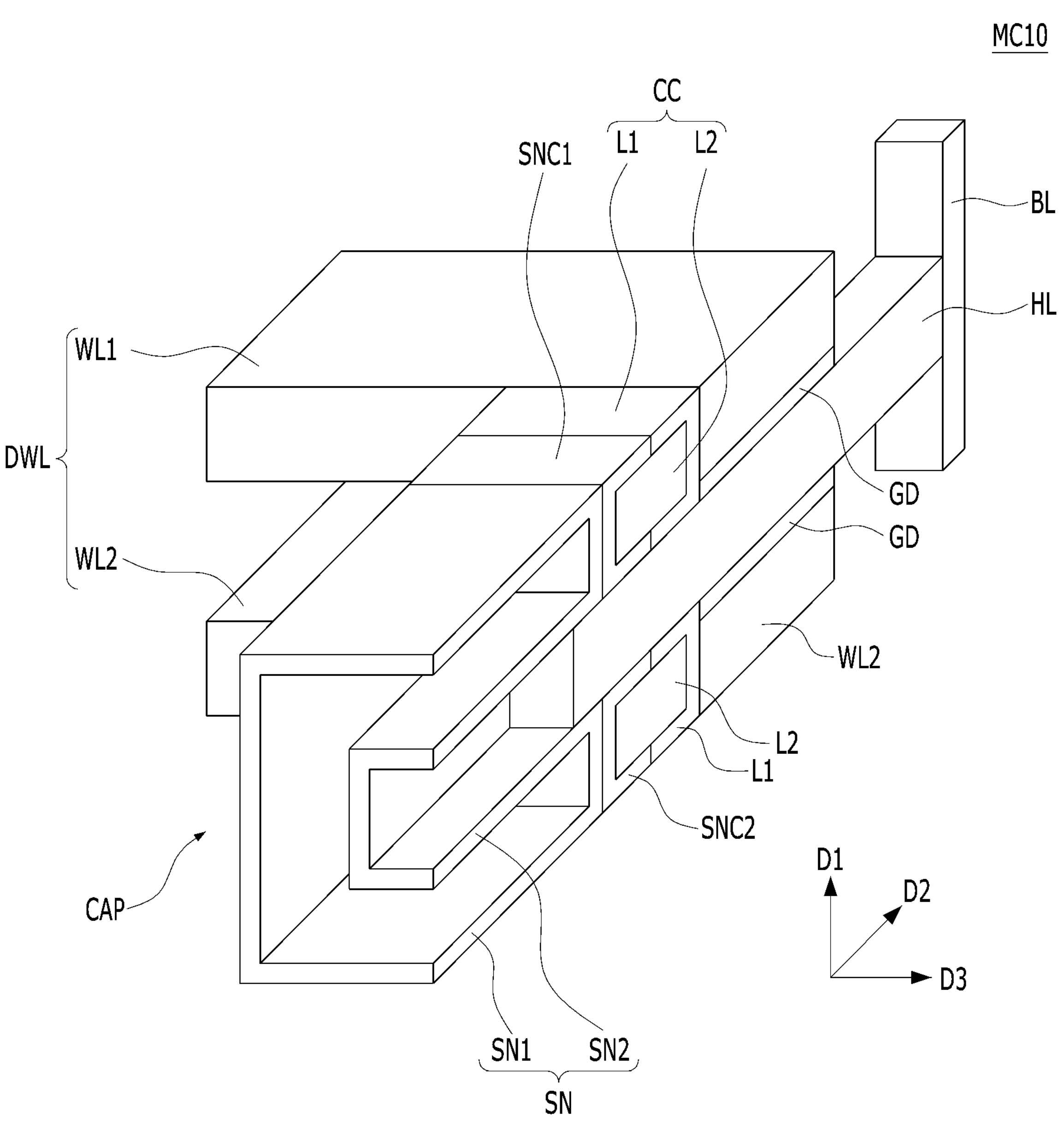
FIG. 21 is a partial perspective view illustrating a memory cell MC10 including the first electrode shown in FIG. 20.
Figure 22:
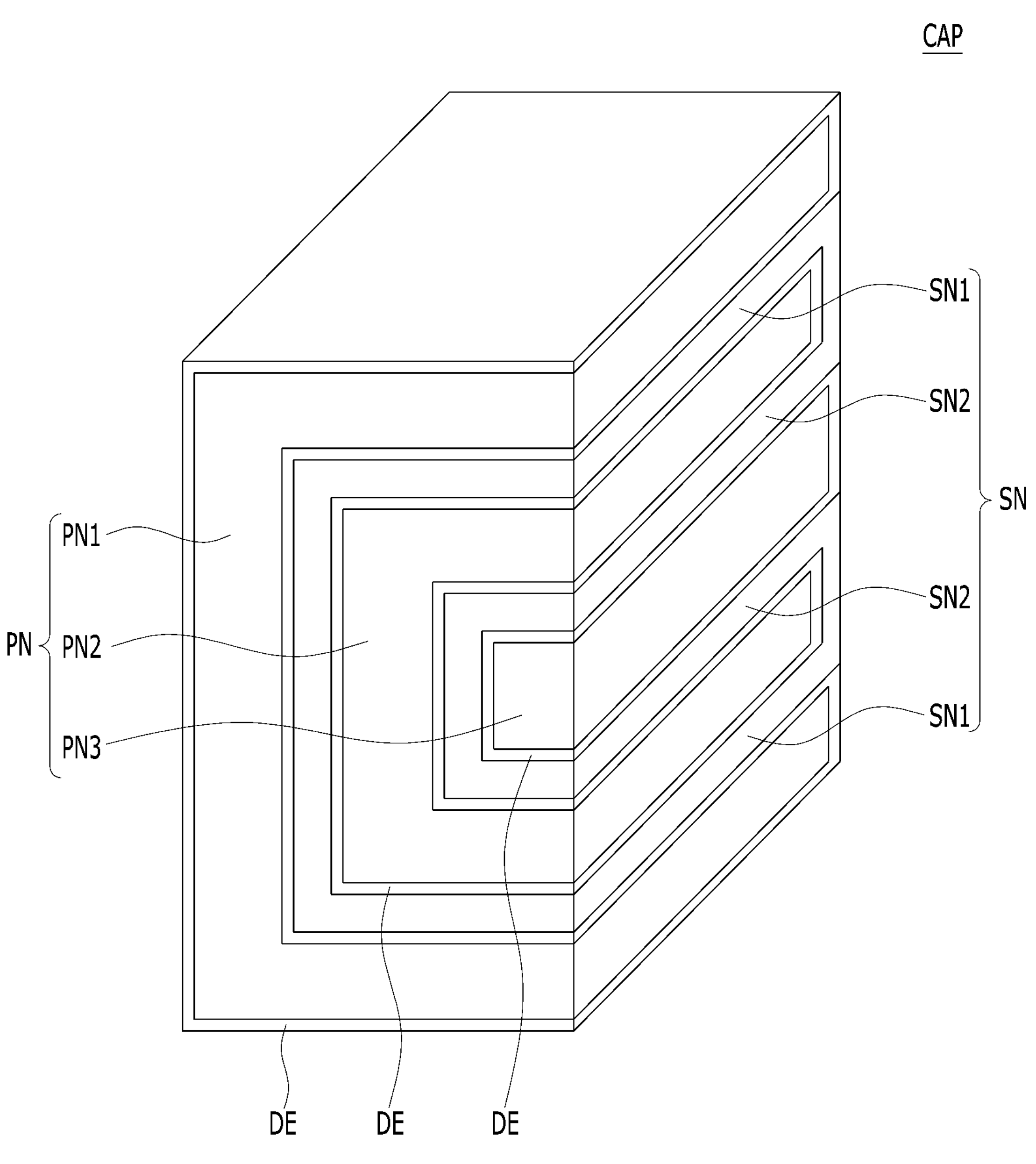
FIG. 22 is a partial perspective view illustrating a data storage element CAP including the first electrode shown in FIG. 20.

FIG. 20 is a perspective view illustrating a first electrode of a data storage element in accordance with another embodiment of the present invention, and FIG. 21 is a partial perspective view illustrating a memory cell MC10 including the first electrode shown in FIG. 20. FIG. 22 is a partial perspective view illustrating the data storage element CAP including the first electrode shown in FIG. 20. The memory cell MC10 may be similar to the memory cell MC of FIGS. 1A and 1B. As for the other constituent elements except for the first electrode SN, FIGS. 1A and 1B may be referred to.

Referring to FIGS. 20 to 22, the memory cell MC10 may include a vertical conductive line BL, a double horizontal conductive line DWL, a horizontal layer HL, and a data storage element CAP. The double horizontal conductive line DWL may include a first horizontal conductive line WL1 and a second horizontal conductive line WL2. The data storage element CAP may include a first electrode SN, a dielectric layer DE, and a second electrode PN. A horizontal dielectric layer GD may be formed between the double horizontal conductive line DWL and the horizontal layer HL. Double contact nodes SNC1 and SNC2 may be disposed between the double horizontal conductive line DWL and the first electrode SN. A second capping layer CC may be disposed between the double contact nodes SNC1 and SNC2 and the double horizontal conductive line DWL. The second capping layer CC may include a first liner L1 and a second liner L2. A first capping layer may be further formed between the vertical conductive line BL and the double horizontal conductive line DWL.

The first electrode SN of the data storage element CAP may include a dual cylinder, for example, a first cylinder SN1 and a second cylinder SN2. The first cylinder SN1 and the second cylinder SN2 may have an integral structure. The first cylinder SN1 may be an outer cylinder, and the second cylinder SN2 may be an inner cylinder. The first cylinder SN1 may include vertical surfaces contacting the double contact nodes SNC1 and SNC2. The second cylinder SN2 may have a through-type cylinder structure. In other words, the second cylinder SN2 may include a through portion surrounding an end of the horizontal layer HL.

The dielectric layer DE may cover the surfaces of the first cylinder SN1 and the second cylinder SN2. The second electrode PN may cover the first cylinder SN1 and the second cylinder SN2 between the dielectric layers DE.

The second electrode PN may include an outer electrode PN1 and inner electrodes PN2 and PN3. The outer electrode PN1 may surround the outer surfaces of the first cylinder SN1. The inner electrodes PN2 and PN3 may include the first inner electrode PN2 that is disposed on a first inner surface S12 of the first cylinder SN1 and surrounds the outer surface of the second cylinder SN2, and a second inner electrode PN3 that is disposed on the inner surface S11 of the second cylinder SN2. The outer electrode PN1 and the inner electrodes PN2 and PN3 may be in contact to each other into an integrated form.

FIGS. 23A to 23D illustrate a semiconductor device in accordance with another embodiment of the present invention. FIGS. 23A to 23D show various embodiments for describing a contact surface between the first electrode and the double contact node as illustrated in FIGS. 1A to 1D. Hereinafter, a contact surface between the first contact node SNC1 of the double contact node and the first cylinder SN1 will be described. The second contact node SNC2 of the double contact node as illustrated in FIGS. 1A to 1D may also have the same shape as that of the first contact node SNC1.

Figure 23A:
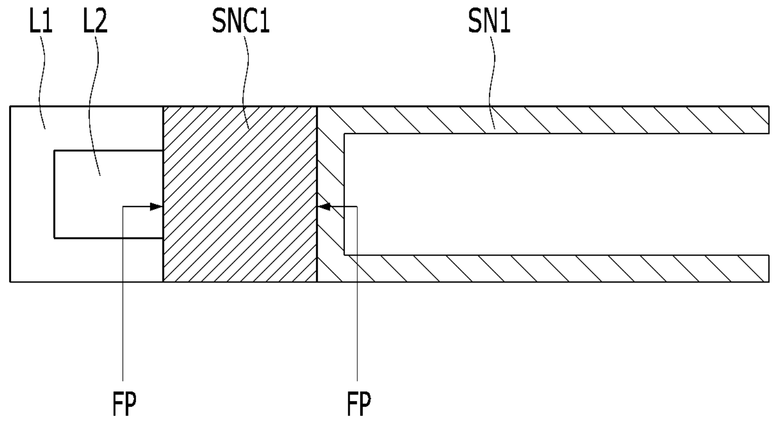
FIGS. 23A to 23D illustrate a semiconductor device in accordance with another embodiment of the present invention.

Referring to FIG. 23A, the first contact node SNC1 of the double contact node may include first and second flat surfaces FP. The first flat surface FP may contact the first liner L1 and the second liner L2, and the second flat surface FP may contact the first cylinder SN1.

Figure 23B:
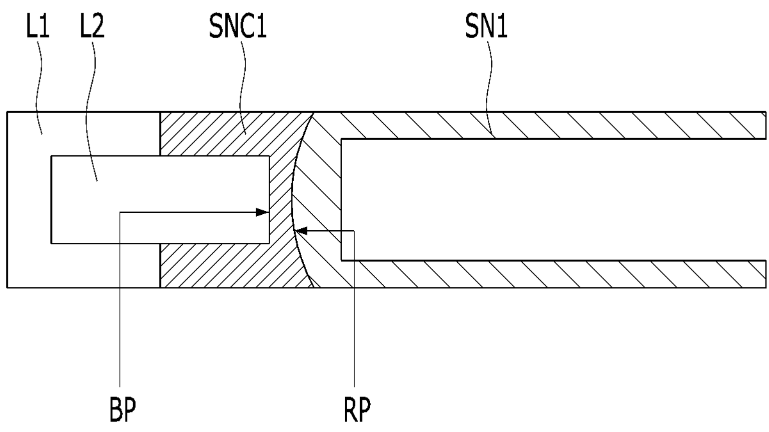

Referring to FIG. 23B, the first contact node SNC1 of the double contact node may include a bended surface BP and a round surface RP. The bended surface BP and the round surface RP may face each other. The bended surface BP may contact the first liner L1 and the second liner L2, and the round surface RP may contact the first cylinder SN1. The bended surface BP may surround a portion of the second liner L2. The first cylinder SN1 may include a round outer surface contacting the round surface RP of the first contact node SNC1.

Figure 23C:
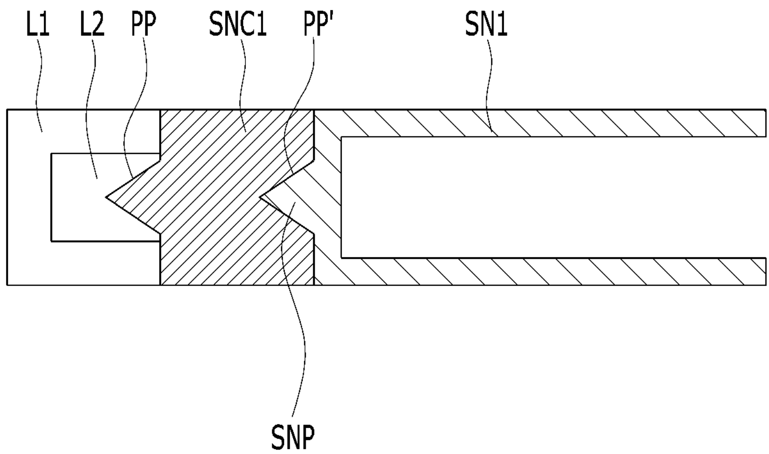

Referring to FIG. 23C, the first contact node SNC1 of the double contact node may include a protruding surface PP and a recessed surface PP'. The protruding surface PP may contact the second liner L2, and the recessed surface PP' may contact the first cylinder SN1. The first cylinder SN1 may include a protruding outer surface SNP contacting the recessed surface PP' of the first contact node SN1.

Figure 23D:
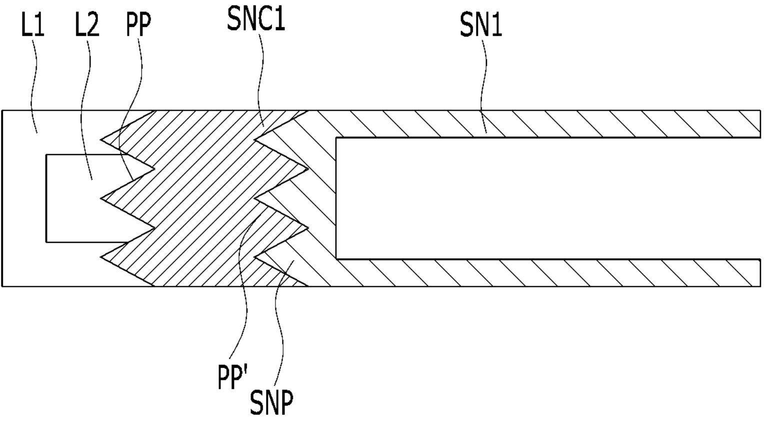

Referring to FIG. 23D, the first contact node SNC1 of the double contact node may include a plurality of protruding surfaces PP and a plurality of recessed surfaces PP'. The protruding surfaces PP may contact the first and second liners L1 and L2, and the recessed surfaces PP' may contact the first cylinder SN1. The first cylinder SN1 may include a plurality of protruding outer surfaces SNP contacting the recessed surfaces PP' of the first contact node SN1.

As described above, contact resistance may be reduced by increasing the contact area between the double contact node SNC1 and the first cylinder SN1 by modifying the contact surface in diverse ways.

Contact surfaces between the first and second cylinders SN1 and SN2 and the double contact node SNC1 and SNC2 as illustrated in FIGS. 20 to 22 may include the shapes as illustrated in FIGS. 23A to 23D.

According to an embodiment of the present invention, since the data storage element includes a dual cylinder, the storage capacity of the data storage element may be increased.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:

a vertical conductive line;

a horizontal layer oriented horizontally from the vertical conductive line;

a horizontal conductive line crossing the horizontal layer; and a data storage element in contact with the horizontal layer, wherein the data storage element includes:

a first electrode including a first cylinder that is in contact with an edge of an upper portion of the horizontal layer and a second cylinder that is in contact with an edge of a lower portion of the horizontal layer;

double contact nodes respectively in contact with the first cylinder and the second cylinder and disposed on the edge of the upper portion and the edge of the lower portion of the horizontal layer;

a second electrode disposed over the first electrode; and a dielectric layer between the first electrode and the second electrode, and the second electrode includes:

a sharing portion disposed in a gap between the first cylinder and the second cylinder;

inner portions disposed on an inner surface of the first cylinder and an inner surface of the second cylinder; and outer portions disposed over the first cylinder and below the second cylinder.

2. The semiconductor device of claim 1, wherein the second electrode further includes an electrode body that is in contact with the sharing portion, the inner portions, and the outer portions.

3. The semiconductor device of claim 2, wherein the sharing portion, the inner portions, the outer portions, and the electrode body have an integrated structure.

4. The semiconductor device of claim 1, wherein the horizontal layer includes monocrystalline silicon, an oxide semiconductor, polysilicon, or a combination thereof.

5. The semiconductor device of claim 1, wherein the double contact nodes include doped polysilicon.

6. The semiconductor device of claim 1, wherein the double contact nodes include a non-flat surface including at least one recessed portion or at least one protruding portion.

7. The semiconductor device of claim 1, wherein each of the double contact nodes includes a flat surface in contact with a corresponding one of the first cylinder and the second cylinder.

8. The semiconductor device of claim 1, wherein each of the double contact nodes includes a round surface contacting a corresponding one of the first cylinder and the second cylinder, and a bended surface opposite to the round surface.

9. The semiconductor device of claim 1, wherein the horizontal conductive line includes:

a first horizontal conductive line disposed on an upper surface of the horizontal layer; and a second horizontal conductive line disposed on a lower surface of the horizontal layer.

10. The semiconductor device of claim 1, wherein the horizontal conductive line includes a dual work function structure.

11. The semiconductor device of claim 1, wherein the horizontal conductive line includes a dual work function structure in which a semiconductor material and a metal-based material are horizontally oriented.

12. The semiconductor device of claim 1, further comprising:

a capping layer disposed between the horizontal conductive line and the double contact nodes.

13. The semiconductor device of claim 12, wherein the double contact nodes include a non-flat surface including at least one protrusion contacting the capping layer.

14. The semiconductor device of claim 12, wherein the double contact nodes include a bended surface contacting the capping layer.

15. The semiconductor device of claim 12, wherein each of the double contact nodes includes a first flat surface contacting a corresponding one of the first cylinder and the second cylinder, and a second flat surface contacting the capping layer.

16. The semiconductor device of claim 1, wherein each of the double contact nodes includes a first flat surface contacting a corresponding one of the first cylinder and the second cylinder, and a non-flat surface opposite to the first flat surface.

17. The semiconductor device of claim 1, wherein the double contact nodes include a non-flat surface comprising a plurality of protrusion portions.

18. The semiconductor device of claim 1, wherein the gap between the first cylinder and the second cylinder exposes a side surface of a doped region in the horizontal layer.

* * * * *